(12) United States Patent
Smetana

(10) Patent No.: US 6,690,207 B1
(45) Date of Patent: Feb. 10, 2004

(54) POWER EFFICIENT EMITTER-COUPLED LOGIC CIRCUIT

(75) Inventor: Kenneth Smetana, San Diego, CA (US)

(73) Assignee: Applied MicroCircuits Corporation, San Diego, CA (US)

( * ) Notice: Subject to any disclaimer, the term of this patent is extended or adjusted under 35 U.S.C. 154(b) by 0 days.

(21) Appl. No.: 10/254,251

(22) Filed: Sep. 25, 2002

(51) Int. Cl.$^7$ .............................................. H03K 19/20
(52) U.S. Cl. ...................... 326/126; 326/127; 326/115; 327/355; 327/356; 327/359
(58) Field of Search .................. 326/126, 127, 326/115; 327/355, 356, 359

(56) References Cited

U.S. PATENT DOCUMENTS

| | | | | |
|---|---|---|---|---|
| 5,552,724 A | * | 9/1996 | Scott ........................... | 326/126 |
| 5,909,127 A | * | 6/1999 | Pearson et al. ............. | 326/115 |
| 6,100,716 A | * | 8/2000 | Adham et al. ................ | 326/68 |
| 6,414,519 B1 | * | 7/2002 | Abernathy ................... | 326/127 |

* cited by examiner

*Primary Examiner*—Vibol Tan
(74) *Attorney, Agent, or Firm*—Law Office of Gerald Maliszewski; Gerald Maliszewski

(57) ABSTRACT

A high bandwidth emitter-coupled logic (ECL) circuit is provided. The ECL circuit comprises an emitter-follower circuit with first and second transistors having collectors connected to a first power supply (Vcc), and emitters operatively connected to a second power supply (Vee2) approximately 1.5 volts less than the first power supply. The transistors receive differential input signals from an interfacing CML circuit. In some aspects, the first power supply is 3.3 volts and the second power supply is 1.8 volts. The CML circuit has an input to receive an input signal, a logic function having a level of series gated logic, first and second differential output signals responsive to the input signal and logic function, and is powered by the first power supply and a third power supply (Vee3) that is approximately equal to Vcc−(0.4+(level of series gated logic)(0.9 volts)).

37 Claims, 4 Drawing Sheets

Fig. 1 *(PRIOR ART)*
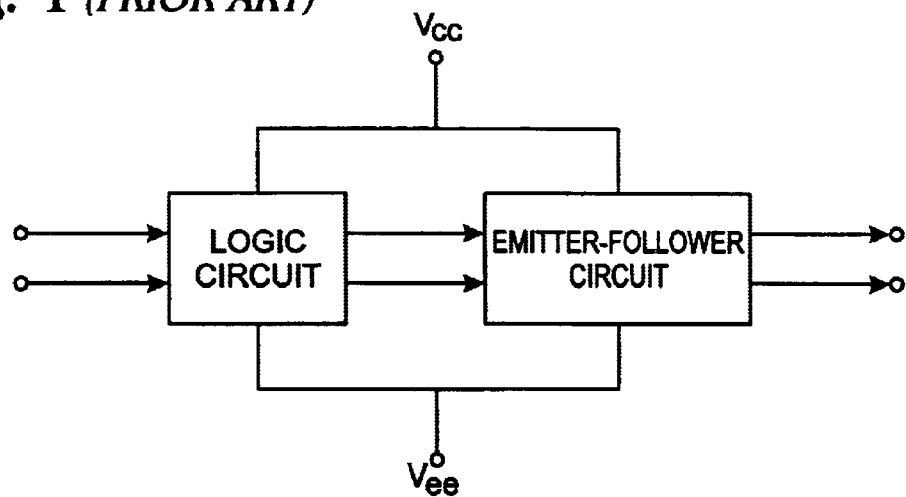
Fig. 2 *(PRIOR ART)*
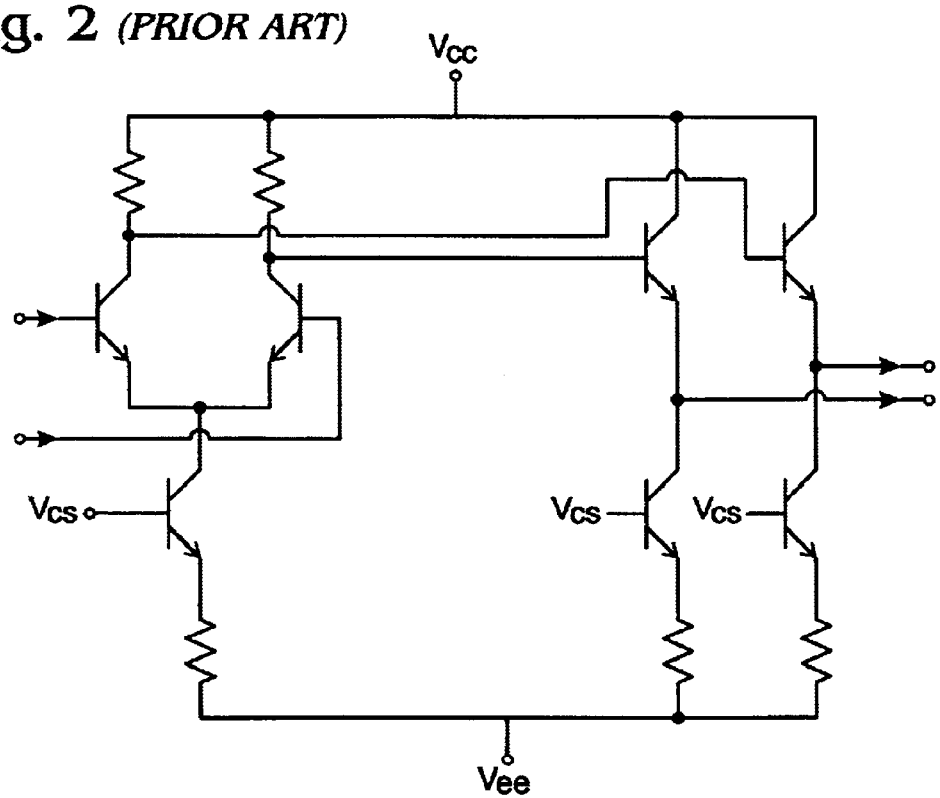

POWER EFFICIENT EMITTER-COUPLED LOGIC CIRCUIT

BACKGROUND OF THE INVENTION

1. Field of the Invention

This invention generally relates to transistor logic circuit design and, more particularly, to a high bandwidth emitter-coupled logic (ECL) design that uses a lower potential between power supplies to improve the overall power efficiency of the circuit.

2. Description of the Related Art

FIG. 1 is a schematic block diagram depicting a conventional ECL circuit, including a current-mode logic (CML) circuit and an interfacing emitter-follower circuit (prior art). There are a variety of conventional CML circuits to implement logic functions such as non-inverting buffers, inverting buffers, AND gates, NAND gates, flip-flops, latches, OR gates, exclusive-OR (XOR), and multiplexers (MUXs), to name but a few. In addition, CML functions can be combined. For example the AND and OR logic functions can be combined in a CML circuit. The emitter-follower circuit shifts the dc levels of the output signals created by the CML and generates a lower output impedance capable of driving larger loads. Vcc, and a lower voltage supply, Vee, are used in powering both the CML and the emitter follower circuits.

FIG. 2 is a detailed schematic diagram of the CML and emitter-follower circuits of FIG. 1 (prior art). Specifically, a CML (non-inverting) buffer is shown. The above-mentioned circuits are: practical in that they operate using only two power supplies, Vcc and Vee. The ability of the circuitry to operate with only two power supplies may be critical in some applications where a limited number of supplies are available. For example, a circuit embedded in a conventional integrated circuit (IC) may only have two power supplies available. However, this conventional circuitry is not necessarily power efficient. In very high-speed IC applications with gigabit data rates, the cumulative effect of inefficient circuits can result in a high thermal dissipation that requires a cooling means, such as a fan and/or a heatsink. Likewise, in battery-operated applications, the cumulative effective of inefficient circuits can result is shorter operating periods between battery charges.

It would be advantageous if a more power efficient CML circuit existed.

It would be advantageous if a more efficient emitter-follower circuit existed, for interfacing with a CML circuit.

It would be advantageous if the above-mentioned lower power CML and lower power emitter-follower circuits were interface compatible for use in an efficient ECL circuit.

SUMMARY OF THE INVENTION

The present invention describes ECL circuitry that can be operated at the highest possible bandwidth, with improved power efficiency. The present invention was designed with the realization that many systems into which ECL circuitry is embedded, now offer a plurality of available power supplies. Many of these power supply voltages are at relatively low voltage potentials. The present invention ECL circuitry makes use of these lower voltage power supplies to reduce overall power consumption.

Accordingly, a high bandwidth emitter-coupled logic (ECL) circuit is provided having reduced power consumption. The ECL circuit comprises an emitter-follower circuit with a first transistor having a collector connected to a first power supply (Vcc) and an emitter operatively connected to a second power supply (Vee2), approximately 1.5 volts less than the first power supply, through a current source. Likewise, a second transistor has a collector connected to the first power supply and an emitter operatively connected to the second power supply through a current source. The transistors receive differential input signals from an interfacing CML transistor pair. In some aspects, the first power supply is 3.3 volts and the second power supply is 1.8 volts. However, the invention is not limited to any particular set of voltages.

The ECL circuit further comprises a CML circuit having an input to receive an input signal, and is designed to implement a logic function with a level of series gated logic. Most of the fundamental logic functions can be performed using between one and four levels of series gated logic, although higher levels of series gated logic are also used. The CML circuit creates first and second differential output signals that are connected to the bases of the first and second transistors and responsive to the input signal and logic function. The CML circuit is powered by the first power supply and a third power supply (Vee3) that is approximately equal to:

$Vcc-(0.4+(\text{the level of series gated logic})(0.9 \text{ volts}))$.

The CML circuit logic function can be a non-inverting buffer, inverting buffer, AND gate, NAND gate, flip-flop, latch, OR gate, exclusive-OR (XOR), multiplexer (MUX), and combinations of the above-mentioned logic functions. As a non-inverting buffer, the CML circuit includes a transistor having a collector operatively connected to the first power supply and the base of the first transistor, a base accepting an input signal, and an emitter. An emitter-coupled transistor has a collector operatively connected to the first power supply and the base of the second transistor, and a base accepting a differential signal approximately 180 degrees out of phase from the input signal. A bias transistor and a series resistor typically connect the coupled emitters to the third power supply.

Additional details of the above-mentioned ECL circuit and a low power method for creating ECL signals are provided below.

BRIEF DESCRIPTION OF THE DRAWINGS

FIG. 1 is a schematic block diagram depicting a conventional ECL circuit, including a current-mode logic (CML) circuit and an interfacing emitter-follower circuit (prior art).

FIG. 2 is a detailed schematic diagram of the CLM and emitter-follower circuits of FIG. 1 (prior art).

DETAILED DESCRIPTION OF THE PREFERRED EMBODIMENTS

Figure 3:
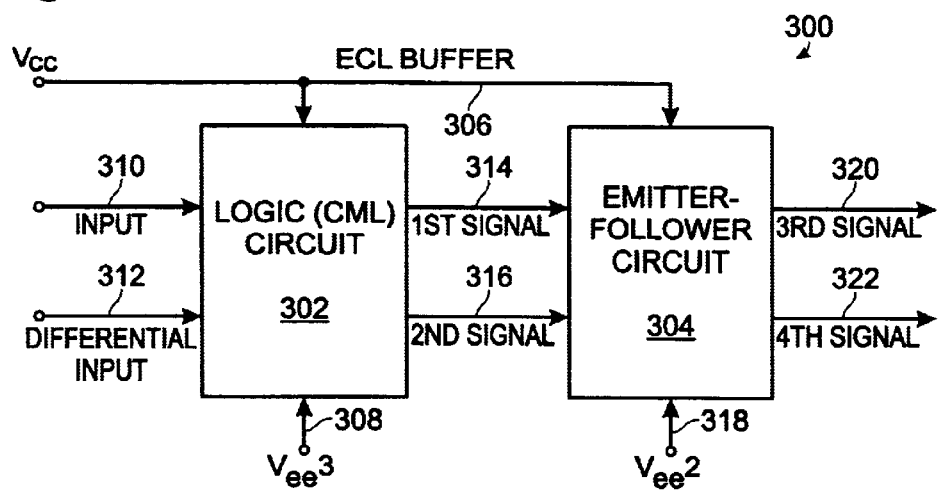
FIG. 3 is a schematic block diagram of the present invention high bandwidth emitter-coupled logic (ECL) circuit with reduced power consumption.

FIG. 3 is a schematic block diagram of the present invention high bandwidth emitter-coupled logic (ECL) circuit with reduced power consumption. The ECL buffer 300 comprises a CML, or logic circuit 302 and an emitter-follower circuit 304. The CML circuit 302 has an input to receive an input signal on line 310, and an input on line 312 accepts a differential signal that is approximately 180 degrees out of phase from the input signal on line 310. Although a differential input is specifically shown, the present invention CML circuit 302 can also be implemented with a single-ended input, as would be well known by those practicing in the art. The CML circuit 302 includes a logic function with a level of series gated logic. That is, the CML circuit 302 is designed to perform a logical function. The CML circuit 302 creates a first signal on line 314, and a second signal on line 316 that is differential (approximately 180 degrees out of phase from the first signal) with respect to the first signal. The output signals on lines 314 and 316 are responsive to the input signal(s) and logic function. The CML circuit 302 is powered by a first power supply (Vcc) and a third power supply (Vee3) that is approximately, or about equal to:

$$Vcc-(0.4+(\text{the level of series gated logic})(0.9 \text{ volts}).$$

The CML circuit 302 logic function can be a non-inverting buffer, inverting buffer, or logic gates such as an AND gate, NAND gate, flip-flop, latch, OR gate, exclusive-OR (XOR), multiplexer (MUX), and combinations of the above-mentioned logic functions. Other equivalent logic functions would be known by those skilled in the art, but are too numerous to mention.

The emitter-follower circuit 304 is connected to the first power supply (Vcc) on line 306 and to a second power supply (Vee2) on line 318. The second power supply is approximately, or about 1.5 volts less than the first power supply. The emitter-follower circuit 304 has an input on line 314 to accept the first signal and an input on line 316 to accept the second signal. The emitter-follower circuit 304 has an output on line 320 to supply a third signal responsive to the first signal on line 314 and an output on line 322 to supply a fourth signal responsive to the second signal on line 316. The outputs are equivalent to conventional emitter-follower outputs, and are responsive to the differential input signal on lines 314 and 316. In some aspects, the first power supply is 3.3 volts and the second power supply is 1.8 volts, as these are voltages that are commonly available. However, the present invention is not limited to any particular voltage levels. The basic operation of the emitter-follower 304 is the same as a conventional emitter-follower circuit.

It should be noted that low-power present invention emitter-follower circuit 304 can be used with a conventional CML circuit, such as the CML circuit portion of the ECL circuit of FIG. 2. Likewise, the present invention low-power CML circuit 302 can be interfaced with a convention emitter-follower circuit, such as the emitter-follower circuit portion of the ECL circuit depicted in FIG. 2. In other aspects of the invention, the low-power emitter follower circuit 304 is interfaced with the low-power CML circuit 302, as shown in FIG. 3 (and FIG. 4 below).

Figure 4:
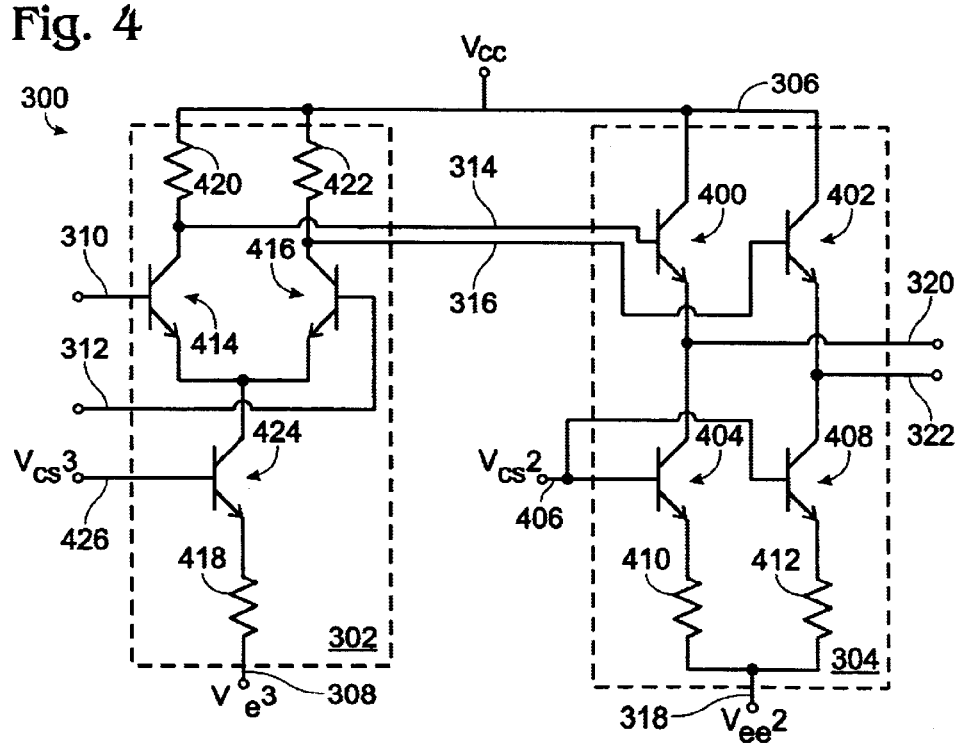
FIG. 4 is a more detailed schematic diagram of the present invention ECL circuit of FIG. 3.

FIG. 4 is a more detailed schematic diagram of the present invention ECL circuit of FIG. 3. The emitter-follower circuit 304 includes a first transistor 400 with a collector connected to a first power supply (Vcc) on line 306, a base to accept the first signal on line 314, and an emitter operatively connected to the second power supply (Vee2) on line 318. As used herein, operatively connected is understood to mean either directly connected or indirectly connected through an additional element. For example, an additional current regulating circuitry is interposed in the connection between the first transistor emitter and Vee2, as explained in more detail below. A second transistor 402 has a collector connected to the first power supply on line 306, a base to accept the second signal on line 316, and an emitter operatively connected to the second power supply. Again, it is typical that the emitter is indirectly connected to Vee2 through a current source.

In some aspects of the emitter-follower circuit 304, bias transistors are used as a current source. A third, bias transistor 404 has a collector connected to the emitter of the first transistor 400, a base to accept a first bias voltage (Vcs2) on line 406, and an emitter operatively connected to the second power supply on line 318. A fourth, bias transistor 408 has a collector connected to the emitter of the second transistor 402, a base to accept the first bias voltage on line 406, and an emitter operatively connected to the second power supply.

A first resistor 410 may be interposed between the third transistor 404 emitter and the second power supply on line 318 in some aspects of the invention. Likewise, a second resistor 412 can be interposed between the fourth transistor 408 emitter and the second power supply on line 318. In some aspects, the third and fourth transistors 404/408 are used without the first and second resistors 410/412. Also note that the order of the first and second resistors 410/412 and the third and fourth transistors 404/408, respectively, may be changed between the first and second transistors 400/402 and the second power supply. In some aspects of the invention, the first 400, second 402, third 404, and fourth 408 transistors are n-p-n transistors. However, some or all of the transistors can be replaced with p-n-p transistors or even field-effect transistors (FETs), with some slight circuit modifications that could be performed by one with an ordinary skill in the art.

As noted above, the CML circuit can be one of many different logic functions. Since these logic functions are well understood and very numerous, a non-inverting buffer logic function with a single level of series gated logic is presented as an example in FIG. 4. Then, the CML circuit 302 includes a fifth transistor 414 having a collector operatively connected to the first power supply and the base of the first transistor 400. The base of the fifth transistor 414 accepts the input signal on line 310. A sixth transistor 416 has a collector operatively connected to the first power supply and the base of the second transistor 402. The sixth transistor 416 has a base to accept the differential signal on line 312, and an emitter connected to the emitter of the fifth transistor 414.

In some aspects, a third resistor 418 can be used having a first end operatively connected to the emitters of the fifth and sixth transistors 414/416, and a second end connected to the third power supply (Vee3) on line 308. A fourth resistor 420 is interposed between the fifth transistor 414 collector and the first power supply on line 306. A fifth resistor 422 is interposed between the sixth transistor 416 collector and the first power supply on line 306.

In some aspects a seventh, bias transistor 424 is used. The seventh transistor 424 has a collector connected to the emitters of the fifth and sixth transistors 414/416, a base to accept a second bias voltage (Vcs3) on line 426, and an emitter connected to the third resistor 418 first end. In other aspects (not shown), the seventh transistor 424 is used without the third resistor 418. Note that the order of the seventh transistor 424 and the third resistor 418, between the emitter of fifth transistor 414 and the third power supply, may be reversed. In some aspects of the invention, the fifth 414, sixth 416, and the seventh 424 transistors are n-p-n transistors. However, some or all of the transistors can be replaced with p-n-p transistors, with some slight circuit modifications that could be performed by one with an ordinary skill in the art. Alternately, the CML circuit can be implemented with either n-channel or p-channel FETs and the emitter-follower circuit can be implemented with MOS source followers. As mentioned above, in some aspects the first power-supply is 3.3 volts and the third power supply is dependent upon the level of series gated logic.

As shown in FIG. 4, in some aspects the CML circuit logic function is implemented with a single level of series gated logic. That is, the logic function is implemented using a single transistor drop between Vcc and the current source. Using the above-mentioned formula, the third voltage can be 1.3 volts lower than Vcc. In other aspects, the third voltage is set to be approximately 2.1 to 2.3 volts lower than the first power supply for effective circuit operation.

Figure 5:
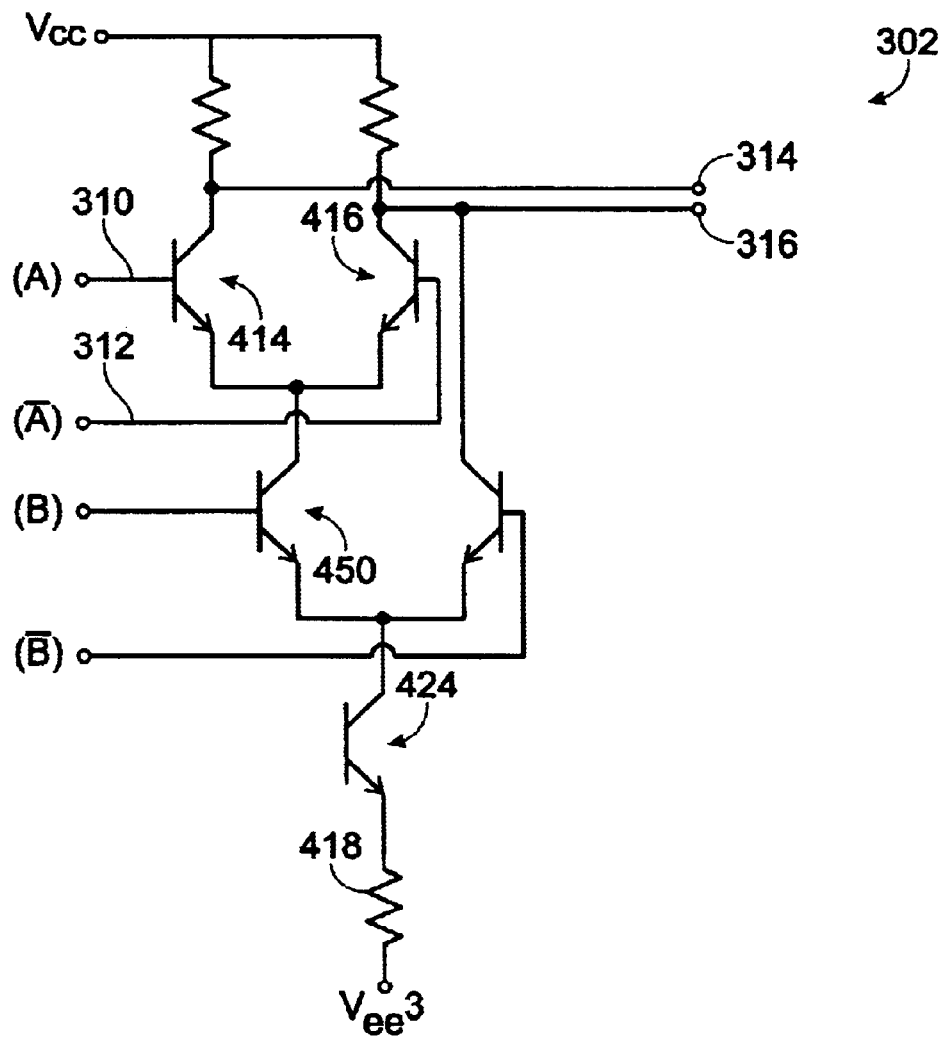
FIG. 5 is a schematic diagram illustrating the present invention CML circuit implemented with two levels of series gated logic.

FIG. 5 is a schematic diagram illustrating the present invention CML circuit implemented with two levels of series gated logic. The CML circuit 302 implements a logic function by adding a level of series gated logic to the single level depicted in FIG. 4. That is, transistor 414 (or 416) and 450 are interposed between Vcc and the current source. Alternately stated, transistor 414 (or 416) is in series with transistor 450. Then the third power supply is approximately 2.1 to 2.3 volts: lower than the first power supply. Using the formula, the third voltage can be set to approximately 2.2 volts lower than Vcc. In other logic functions the invention is implemented with three levels of series gated logic (not shown). Then, the third power supply would be approximately 3.1 volts lower than the first power supply. When four levels of series gated logic are used, the third power supply is approximately 4.0 volts lower than the first power supply.

Functional Description

As mentioned above, the present invention emitter-follower circuit uses a supply (Vee2) that is set to Vcc−1.5V, to save power in the output section. Conventionally, the lower supply (Vee) is in the range from Vcc−3.3 to Vcc−5.2 V. However, the power dissipated by the emitter-followers is much less when Vee2 is used, instead of Vee. Comparing the use Vee2 (Vcc−1.5 volts) to the conventional power supply Vee (Vcc−3.3 volts), a power savings can be calculated as follows:

1−(1.5/3.3)=0.55.

That is, a 55% power savings can be realized. Typically, the current used in the output followers is between 66–80% of the total macro current. Hence, the overall power savings is 36–44%, even if conventional CML circuits are interfaced to the low-power emitter-follower.

A second aspect of the invention is the efficient use of CML circuit power supplies. Assuming one or two levels of series gated logic, Vee3 is set in the range from Vcc−2.1V to Vcc−2.3V to save power in the logic section. That is, Vee3, instead of Vee (convention circuit, see FIG. 2), can be used to implement the 1 or 2 levels of series gated logic. The power saving due to the use of Vee3 is as follows:

1−(2.1/3.3)=0.36 or,

1−(2.3/3.3)=0.30.

That is, the power is reduced by approximately 30–36%.

The low-power CML and emitter-follow circuits are compatible with each other, and no translation is required to interface the two circuits. This is because both the circuit's signal levels are set relative to Vcc.

The present invention has the same bandwidth as conventional ECL circuits. However, the present invention circuits can be implemented with a typical power savings of 55% from the output (emitter-follower circuit) and a 30–36% savings in the CML circuit. Further, it is possible to combine the low-power circuits for additional power savings. The only disadvantage over conventional circuits is that the present invention requires additional power supplies. However, lower power supplies have become common in many systems. For example, 3.3, 1.8, 1.2, and 1.0 V supplies are commonly used, and support the present invention circuits.

Figure 6:
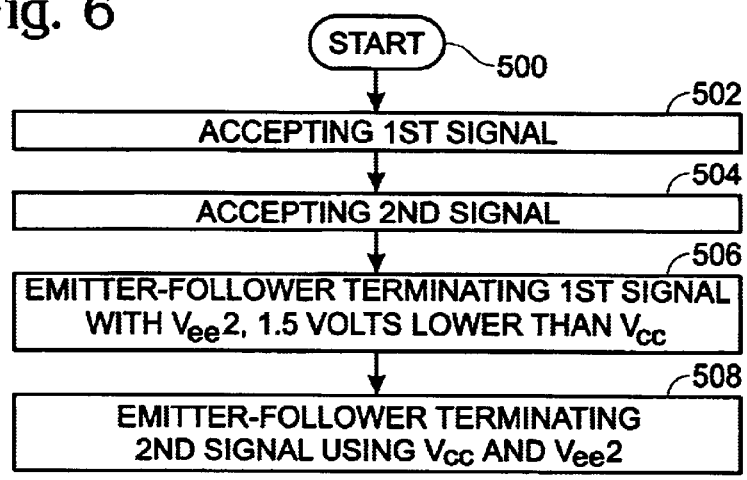
FIG. 6 is a flowchart illustrating the present invention low power method for creating ECL logic signals.

FIG. 6 is a flowchart illustrating the present invention low power method for creating ECL logic signals. Although the method (and the method explained FIG. 7, below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 accepts a first signal. Step 504 accepts a second signal approximately 180 degrees out of phase from the first signal. Step 506 emitter-follower terminates the first signal using a first power supply (Vcc) and a second power supply (Vee2) having a voltage approximately 1.5 volts lower than the first power supply voltage. Step 508 emitter-follower terminates the second signal using the first and second power supplies. In some aspects of the method, emitter-follower terminating in Step 506 and 508 includes the first power supply being 3.3 volts and the power supply being 1.8 volts.

Figure 7:
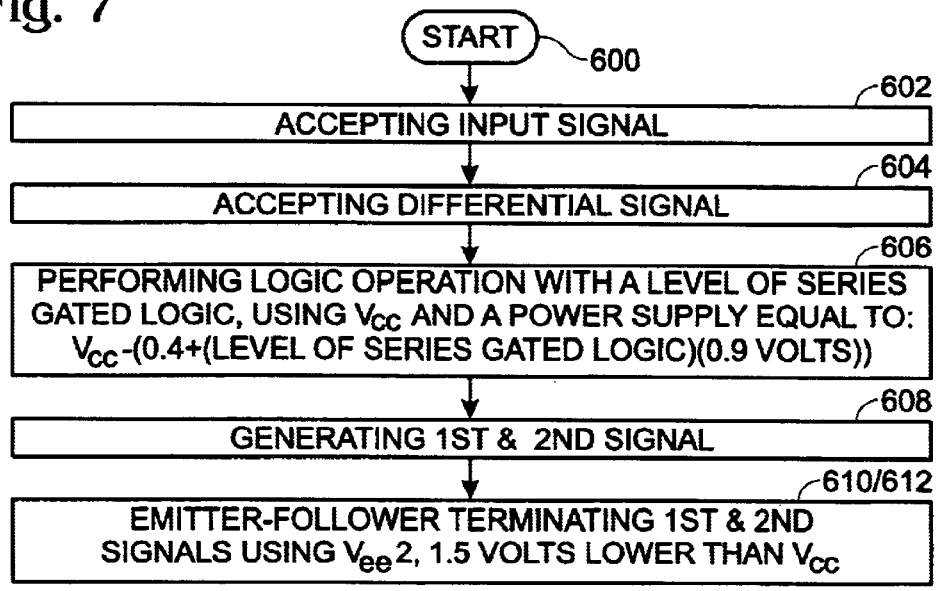
FIG. 7 is a flowchart illustrating the present invention low power method for generating ECL signals.

FIG. 7 is a flowchart illustrating the present invention low power method for generating ECL signals. The method starts at Step 600. Step 602 accepts an input signal. Step 604 accepts a differential signal approximately 180 degrees out of phase from the input signal. Step 606 performs a logic operation with a level of series gated logic using a first power supply (Vcc) and a third power supply (Vee3) having a voltage approximately equal to Vcc−(0.4+(the level of series gated logic)(0.9 volts)). Step 608, in response to input signals and the logic operation, generates a first signal and a second signal, approximately 180 degrees out of phase from the first signal.

In some aspects of the method, Step 610 emitter-follower terminates the first signal using the first power supply and a second power supply (Vee2) having a voltage approximately 1.5 volts lower than the first power supply. Step 612 emitter-follower terminates the second signal using the first and second power supplies.

In other aspects, emitter-follower terminating in Step 610 and 612 includes the first power supply being 3.3 volts and the second power supply being 1.8 volts.

A low-power high-bandwidth ECL circuit has been presented. As shown, low-power CML and emitter-follower circuits can be used independently or combined for greater power savings. A specific example of a CML buffer logic function has been given to illustrate the invention using specific power supply levels and particular circuit configurations. However, other variations and embodiments of the invention, using other logic functions and/or current sources, could easily be developed by those skilled in the art using the basic principles presented above.

I claim:

1. An emitter-coupled logic (ECL) circuit with reduced power consumption, the ECL circuit comprising:

an emitter-follower circuit including:

a first transistor with a collector connected to a first power supply (Vcc), a base to accept a first signal, and an emitter operatively connected to a second power supply (Vee2) approximately 1.5 volts less than the first power supply; and, a second transistor with a collector connected to the first power supply, a base to accept a second signal approximately 180 degrees out of phase from the first signal, and an emitter operatively connected to the second power supply.

2. The ECL circuit of claim 1 wherein the emitter-follower circuit further includes:

a third, bias transistor having a collector connected to the first transistor emitter, a base to accept a first bias voltage (Vcs2), and an emitter operatively connected to the second power supply; and, a fourth, bias transistor having a collector connected to the second transistor emitter, a base to accept the first bias voltage, and an emitter operatively connected to the second power supply.

3. The ECL circuit of claim 2 wherein the emitter-follower circuit further includes:

a first resistor interposed between the third transistor emitter and the second power supply; and, a second resistor interposed between the fourth transistor emitter and the second power supply.

4. The ECL circuit of claim 3 wherein the first, second, third, and fourth transistors are n-p-n transistors.

5. The ECL circuit of claim 4 wherein the first power supply is 3.3 volts and the second power supply is 1.8 volts.

6. The ECL circuit of claim 4 further comprising:

a current-mode logic (CML) circuit having an input to receive an input signal, a logic function having a level of series gated logic, first and second differential output signals connected to the bases of the first and second transistors responsive to the input signal and logic function, and is powered by the first power supply and a third power supply (Vee3) that is approximately equal to:

Vcc−(0.4+((level of series gated logic)*(0.9 volts))).

7. The ECL circuit of claim 6 wherein the CML circuit logic function is selected from the group including non-inverting buffers, inverting buffers, AND gates, NAND gates, flip-flops, latches, OR gates, exclusive-ORs (XORs), multiplexers (MUXs), and combinations of the above-mentioned logic functions.

8. The ECL circuit of claim 7 wherein the CML circuit logic function is implemented with a single level of series gated logic wherein the third voltage is approximately 1.3 volts lower than the first power supply.

9. The ECL circuit of claim 7 wherein the CML circuit logic function is implemented with two levels of series gated logic wherein the third voltage is in the range of 2.1 to 2.3 volts lower than the first power supply.

10. The ECL circuit of claim 7 wherein the CML logic function is a non-inverting buffer including:

a fifth transistor having a collector operatively connected to the first power supply and the base of the first transistor, a base accepting an input signal, and an emitter;

a sixth transistor having a collector operatively connected to the first power supply and the base of the second transistor, a base accepting a differential signal approximately 180 degrees out, of phase from the input signal, and an emitter connected to the emitter of the fifth transistor; and, a third resistor having a first end operatively connected to the emitters of the fifth and sixth transistors and a second end connected to the third power supply.

11. The ECL circuit of claim 10 wherein the CML circuit further includes:

a fourth resistor interposed between the fifth transistor collector and the first power supply; and, a fifth resistor interposed between the sixth transistor collector and the first power supply.

12. The ECL circuit of claim 11 wherein the CML circuit further includes:

a seventh, bias transistor having a collector connected to the emitters of the fifth and sixth transistors, a base to accept a second bias voltage (Vcs3), and an emitter connected to the third resistor first end.

13. The ECL circuit of claim 7 wherein the CML circuit logic function is implemented with three levels of series gated logic and wherein the third voltage is 3.1 volts lower than the first power supply.

14. The ECL circuit of claim 7 wherein the CML circuit logic function is implemented with four levels of series gated logic and wherein the third voltage is approximately 4.0 volts lower than the first power supply.

15. A low power consumption emitter-coupled logic (ECL) circuit comprising:

a current-mode logic (CML) circuit having an input to receive an input signal, a logic function having a level of series gated logic, first and second differential output signals responsive to the input signal and logic function, and is powered by a first power supply (Vcc) and a third power supply (Vee3) that is approximately equal to:

Vcc−(0.4+((level of series gated logic)*(0.9 volts))).

16. The ECL circuit of claim 15 wherein the CML circuit logic function is selected from the group including non-inverting buffers, inverting buffers, AND gates, NAND gates, flip-flops, latches, OR gates, exclusive-ORs (XORs), multiplexers (MUXs), and combinations of the above-mentioned logic functions.

17. The ECL circuit of claim 16 wherein the CML circuit logic function is implemented with a single level of series gated logic and wherein the third voltage is approximately 1.3 volts lower than the first power supply.

18. The ECL circuit of claim 16 wherein the CML circuit logic function is implemented with two levels of series gated logic and wherein the third voltage is in the range of 2.1 to 2.3 volts lower than the first power supply.

19. The ECL circuit of claim 16 wherein the CML circuit logic function is implemented with three levels of series gated logic and wherein the third voltage is approximately 3.1 volts lower than the first power supply.

20. The ECL circuit of claim 16 wherein the CML circuit logic function is implemented with four levels of series gated logic and wherein the third voltage is approximately 4.0 volts lower than the first power supply.

21. The ECL circuit of claim 16 wherein the CML circuit is a non-inverting buffer including:

a fifth transistor having a collector operatively connected to the first power supply, supplying the first signal, a base accepting an input signal, and an emitter;

a sixth transistor having a collector operatively connected to the first power supply, supplying the second signal approximately 180 degrees out of phase from the first signal, a base accepting a differential signal approximately 180 degrees out of phase from the input signal, and an emitter connected to the emitter of the fifth transistor; and, a third resistor having a first end operatively connected to the emitters of the fifth and sixth transistors, and a second end connected to the third power supply.

22. The ECL circuit of claim 21 wherein the CML circuit further includes:

a fourth resistor interposed between the fifth transistor collector and the first power supply; and, a fifth resistor interposed between the sixth transistor collector and the first power supply.

23. The ECL circuit of claim 22 wherein the CML circuit further includes:

a seventh, bias transistor having a collector connected to the emitters of the fifth and sixth transistors, a base to accept a second bias voltage (Vcs3), and an emitter connected to the third resistor first end.

24. The ECL circuit of claim 23 wherein the fifth, sixth, and seventh transistors are n-p-n transistors.

25. The ECL circuit of claim 24 wherein the first power supply is 3.3 volts.

26. The ECL circuit of claim 15 further comprising an emitter-follower circuit including:

a first transistor with a collector connected to the first power supply, a base connected to the CML circuit to accept the first signal, and an emitter operatively connected to a second power supply (Vee2) approximately 1.5 volts less than the first power supply; and, a second transistor with a collector connected to the first power supply, a base connected to the CML circuit to accept the second signal, and an emitter operatively connected to the second power supply.

27. The ECL circuit of claim 26 wherein the emitter-follower further includes:

a third, bias transistor having a collector connected to the first transistor emitter, a base to accept a first bias voltage (Vcs2), and an emitter operatively connected to the second power supply; and, a fourth, bias transistor having a collector connected to the second transistor emitter, a base to accept the first bias voltage, and an emitter operatively connected to the second power supply.

28. The ECL circuit of claim 27 wherein the emitter-follower circuit further includes:

a first resistor interposed between the third transistor emitter and the second power supply; and, a second resistor interposed between the fourth transistor emitter and the second power supply.

29. The ECL circuit of claim 28 wherein the emitter-follower first, second, third, and fourth transistors are n-p-n transistors.

30. The ECL circuit of claim 29 wherein the first power supply is 3.3 volts and the second power supply is 1.8 volts.

31. A low power method for creating emitter-coupled logic (ECL) signals, the method comprising:

accepting a first signal;

accepting a second signal approximately 180 degrees out of phase from the first signal;

emitter-follower terminating the first signal using a first power supply (Vcc) and a second power supply (Vee2) having a voltage approximately 1.5 volts lower than the first power supply voltage; and, emitter-follower terminating the second signal using the first and second power supplies.

32. The method of claim 31 wherein emitter-follower terminating includes the first power supply being 3.3 volts and the power supply being 1.8 volts.

33. A low power method for generating emitter-coupled logic (ECL) signals, the method comprising:

accepting an input signal;

accepting a differential signal approximately 180 degrees out of phase from the input signal;

performing a logic operation with a level of series gated logic using a first power supply (Vcc) and a third power supply (Vee3) having a voltage approximately equal to Vcc−(0.4+((the level of series gated logic)*(0.9 volts))); and, in response to input signals and the logic operation, generating a first signal, and a second signal approximately 180 degrees out of phase from the first signal.

34. The method of claim 33 further comprising:

emitter-follower terminating the first signal using the first power supply and a second power supply (Vee2) having a voltage approximately 1.5 volts lower than the first power supply; and, emitter-follower terminating the second signal using the first and second power supplies.

35. The method of claim 34 wherein emitter-follower terminating includes the first power supply being 3.3 volts and the second power supply being 1.8 volts.

36. A high bandwidth emitter-coupled logic (ECL) circuit with reduced power consumption, the ECL circuit comprising:

a current-mode logic (CML) circuit including a logic function having a level of series gated logic, connected to a first power supply (Vcc) and to a third power supply (Vee3) having a voltage approximately equal to Vcc−(0.4+((the level of series gated logic)*(0.9 volts))), having an input to accept an input signal, an input to accept a differential signal approximately 180 degrees out of phase from the input signal, an output to supply a first signal in response to the input signal, and an output to supply a second signal, approximately 180 degrees out of phase from the first signal; and, an emitter-follower circuit connected to the first,power supply and to a second power supply (Vee2) approximately 1.5 volts less than the first power supply, having an input to accept the first signal, an input to accept the second signal, an output to supply a third signal responsive to the first signal, and an output to supply a fourth signal responsive to the second signal.

37. The ECL circuit of claim 36 wherein the first power supply is 3.3 volts and the second power supply is 1.8 volts.

* * * * *